(12) United States Patent
Li et al.

(10) Patent No.: US 9,715,889 B1
(45) Date of Patent: Jul. 25, 2017

(54) READ SENSOR HAVING AN INSULATING LAYER CAPABLE OF USE IN TWO-DIMENSIONAL MAGNETIC RECORDING

(71) Applicant: Western Digital (Fremont), LLC, Fremont, CA (US)

(72) Inventors: Shaoping Li, San Ramon, CA (US); Gerardo A. Bertero, Redwood City, CA (US); Ming Mao, Dublin, CA (US); Shihai He, Fremont, CA (US); Steven C. Rudy, Carmel Valley, CA (US); Haiwen Xi, San Jose, CA (US); Zhipeng Li, Fremont, CA (US); Haifeng Wang, San Jose, CA (US); Jianxin Fang, San Jose, CA (US); Zhihong Zhang, Fremont, CA (US); Yingbo Zhang, San Ramon, CA (US); Qunwen Leng, Palo Alto, CA (US); Christopher L. Beaudry, San Jose, CA (US); Ruisheng Liu, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 15/240,311

(22) Filed: Aug. 18, 2016

(51) Int. Cl.
*G11B 5/39* (2006.01)
*G01R 33/09* (2006.01)
*G01R 33/00* (2006.01)

(52) U.S. Cl.
CPC ........ *G11B 5/3929* (2013.01); *G01R 33/0052* (2013.01); *G01R 33/098* (2013.01); *G11B 5/39* (2013.01); *G11B 5/3909* (2013.01); *G11B 5/3912* (2013.01); *G11B 5/3932* (2013.01)

(58) Field of Classification Search
CPC ........ G11B 5/39; G11B 5/3909; G11B 5/3932
USPC .................................. 360/320, 324.11, 324.2
See application file for complete search history.

(56) References Cited

U.S. PATENT DOCUMENTS

| | | |
|---|---|---|
| 7,111,382 B1 | 9/2006 | Knapp |
| 7,335,580 B1 | 2/2008 | Buerger, Jr. |
| 7,944,651 B2 | 5/2011 | Ousugi |
| 8,315,019 B1 | 11/2012 | Mao |
| 8,537,503 B2 | 9/2013 | Watanabe |
| 8,922,953 B1 * | 12/2014 | Childress ............. G11B 5/3912 360/319 |
| 9,082,436 B1 * | 7/2015 | Mashima ............. G11B 5/3929 |

(Continued)

*Primary Examiner* — Jefferson Evans
(74) *Attorney, Agent, or Firm* — Foley & Lardner LLP (57) ABSTRACT

A magnetic read apparatus has a media-facing surface (MFS) and includes a read sensor, a magnetic bias structure and an insulating layer. The read sensor has a side, a front occupying part of the MFS and a back. The read sensor includes a free layer, a pinned layer and a barrier layer between the free and pinned layers. The barrier layer has a barrier layer coefficient of thermal expansion. The magnetic bias structure is adjacent to the side of the free layer. The insulating layer includes first and second portions. The first portion of the insulating layer is between the read sensor side and the magnetic bias structure. The second portion of the insulating layer adjoins the read sensor back. The insulating layer has an insulating layer coefficient of thermal expansion that is at least ⅓ of and not more than ⅔ of the barrier layer coefficient of thermal expansion.

20 Claims, 5 Drawing Sheets

(56) References Cited

U.S. PATENT DOCUMENTS

| | | | |
|---|---|---|---|
| 2006/0092582 A1* | 5/2006 | Gill | B82Y 10/00 360/324.12 |
| 2007/0111332 A1 | 5/2007 | Zhao | |
| 2008/0151441 A1* | 6/2008 | Freitag | B82Y 25/00 360/324.11 |
| 2012/0240390 A1* | 9/2012 | Degawa | G01R 33/093 29/603.01 |
| 2014/0252518 A1* | 9/2014 | Zhang | H01L 43/12 257/422 |
| 2016/0055866 A1* | 2/2016 | Le | G11B 5/39 360/75 |
| 2016/0163338 A1* | 6/2016 | Ho | G11B 5/3932 360/75 |

* cited by examiner

READ SENSOR HAVING AN INSULATING LAYER CAPABLE OF USE IN TWO-DIMENSIONAL MAGNETIC RECORDING

BACKGROUND

A read apparatus typically includes a read sensor and side magnetic bias structures that are between top and bottom shields. The read sensor is typically a tunneling magnetoresistive (TMR) sensor. The read sensor generally includes an antiferromagnetic (AFM) layer, a pinned layer, a tunneling barrier layer and a free layer. If the sensor is to be used in a current perpendicular to plane (CPP) configuration, then current is driven in a direction substantially perpendicular to the plane of the layers. In such cases, an insulating layer generally separates the sides of the read sensor from the side magnetic bias structures. The side magnetic bias structures are used to magnetically bias the free layer.

To fabricate the read apparatus, the read sensor stack is full film deposited. The read sensor stack includes the layers within the read sensor. In addition, a high temperature anneal may be performed in order to improve the crystal structure of one or more of the layers in the stack. A mask covering the region of the stack that will form the sensor is provided and the exposed portion of the stack removed. This is typically accomplished via ion milling. An insulating layer is grown or deposited and the magnetic bias structures provided. The mask may then be removed. Another mask that covers the read sensor and side magnetic bias structures is provided. This mask is used to define the stripe height of the read sensor and only extends the stripe height from the desired location of the air-bearing surface (ABS). The exposed portions of the read sensor stack and magnetic bias structures are removed. An insulating refill material, such as aluminum oxide, is deposited. Thus, the refill material adjoins, or shares interfaces with, the backs of the read sensor and side bias structures. Formation of the read apparatus may then be completed.

Although the read apparatus and method for fabricating the conventional read apparatus function, there are drawbacks. For example, the magnetic read apparatus is desired to be extended to higher areal densities. As a result, the dimensions of the structures are desired to be made smaller. Further, other recording technologies such as two-dimensional magnetic recording (TDMR) may be desired to be explored as part of higher areal density recording. In TDMR, multiple read sensors are used. Read sensors are typically offset in the down track and the cross-track directions so that adjacent tracks may be read. Because the read apparatus is built such that layers in the down track direction are formed later, fabrication of one sensor is typically completed before fabrication of the next sensor starts. Thus, the lower (earlier fabricated) sensor(s) of a TDMR read apparatus may undergo additional high temperature anneals during formation of subsequent sensor(s). These additional anneals may adversely affect performance and reliability of the lower sensor(s). Thus, performance, reliability and manufacturability of a TDMR read apparatus may be adversely affected.

Accordingly, what is needed is a system and method for improving the performance of a magnetic recording read apparatus.

DETAILED DESCRIPTION OF THE PREFERRED EMBODIMENTS

While the various embodiments disclosed are applicable to a variety of data storage devices such as magnetic recording disk drives, solid-state hybrid disk drives, networked storage systems etc., for the sake of illustration the description below uses disk drives as examples.

Figure 1A:
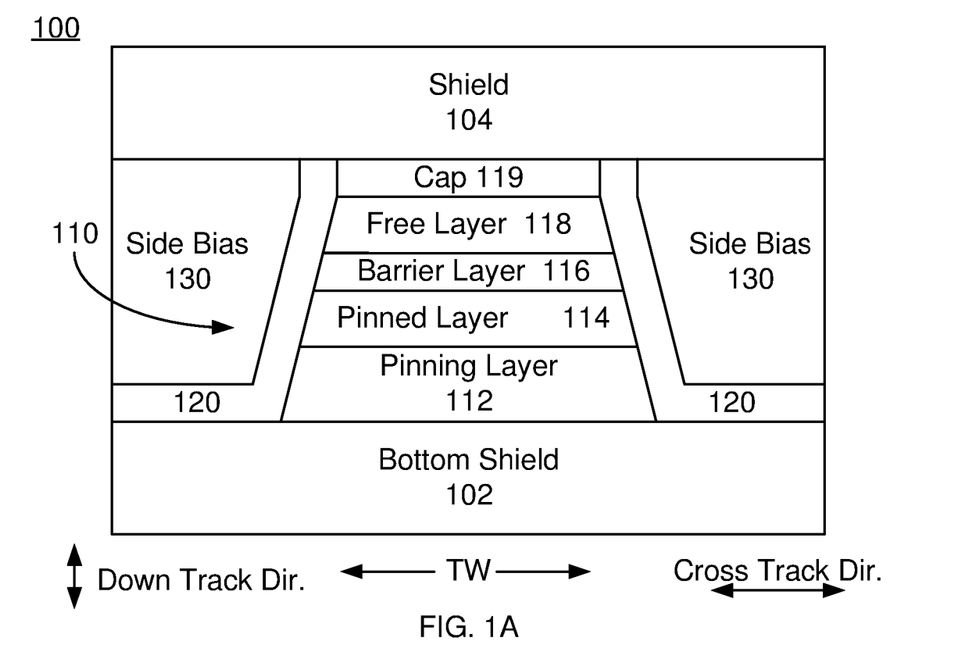
FIGS. 1A and 1B depict media-facing surface and apex views of an exemplary embodiment of a magnetic recording read apparatus.
Figure 1B:
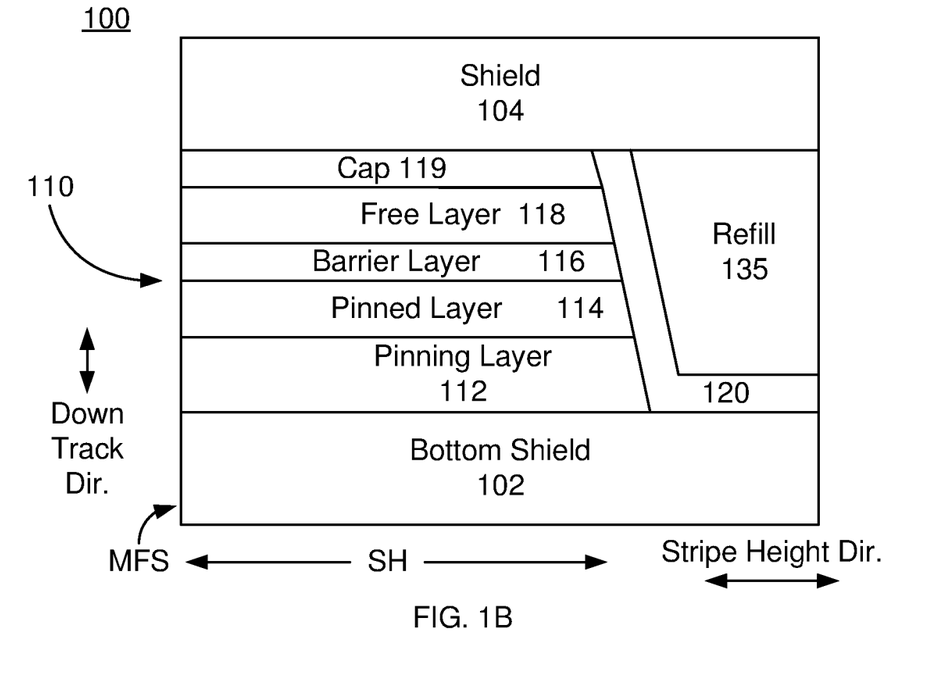

FIGS. 1A and 1B media-facing surface (MFS) and apex views of an exemplary embodiment of a portion of a read apparatus 100 in a data storage device. The MFS is proximate to the media (not shown) during use. For clarity, FIGS. 1A and 1B are not to scale. In the embodiment shown, the data storage device may be a disk drive. Therefore, the MFS may be an air-bearing surface (ABS). In some embodiments, the MFS is a different gas-bearing surface, e.g. helium. For simplicity not all portions of the read apparatus 100 and disk drive are shown. For example, in some embodiments, additional sensor(s) and associated structures may be included. Such a read apparatus may be used in two-dimensional magnetic recording (TDMR). Although the read apparatus 100 is depicted in the context of particular components other and/or different components may be used. For example, circuitry used to drive and control various portions of the read apparatus 100 is not shown. The slider on which the read apparatus 100 is formed is generally attached to a suspension (not shown). In general, the data storage device includes the read apparatus 100, a write apparatus (not shown) and a media such as a disk. However, only the read apparatus is shown. For simplicity, only single components are shown. However, multiples of each components and/or and their sub-components, might be used.

The read apparatus 100 includes a bottom shield 102, an upper shield 104, a read sensor 110, an insulating layer 120, magnetic bias structures 130 and refill 135. As discussed above, portions of the components 102, 104, 110, 120, 130 and/or 135 may include multiple layers. In other embodiments, different and/or additional components may be used in the read apparatus 100.

The shields 102 and 104 may be monolithic (single layer) shields or multilayer shields. For example, the bottom shield 102 and/or the upper shield 104 may be a layer of NiFe. One or both of the shields 102 and 104 may be an antiferromagnetically coupled shield including multiple ferromagnetic layers interleaved with one or more nonmagnetic layer(s). The shields 102 and 104 may function as leads for the read sensor 110. The refill 135 is insulating and may include or consist of aluminum oxide. Thus, the coefficient of thermal expansion of the refill 135 is generally very different from the barrier layer coefficient of thermal expansion, described below.

The read sensor 110 may be a magnetic tunneling magnetoresistance (TMR) sensor or analogous device. The read sensor 110 has sides in the cross-track direction, as shown in FIG. 1A. The sides of the read sensor 110 provide a track width of TW. As can be seen in FIG. 1B, the read sensor 110 has a front surface that is at the MFS and a rear surface that is opposite to the MFS. In the embodiment shown, the read sensor 110 includes a pinning layer 112, a pinned layer 114, a tunneling barrier layer 116, a free layer 118 and an optional capping layer 119. The pinning layer 112 may be an antiferromagnetic (AFM) layer such as IrMn. The pinned layer 114 and free layer 118 are magnetic. The pinned, or reference, layer 114 has its magnetic moment fixed by the pinning layer 112. The magnetic moment of the free layer 118 responds to the field from the media. The pinned layer 114 and/or the free layer 118 may be single-layer or a multilayer. A multilayer pinned layer 114 and/or free layer 118 may include both magnetic layers and nonmagnetic layer(s). The tunneling barrier layer 116 is between the free layer 118 and the pinned layer 114 in the down track direction. The tunneling barrier layer 116 is a nonmagnetic insulator, such as crystalline MgO. The barrier layer 116 has a barrier layer coefficient of thermal expansion. The magnetic bias structures 130 may be hard or soft bias structures and magnetically bias the free layer of the read sensor 110.

The insulating layer 120 resides on the sides and the back of the read sensor 110. Stated differently, one portion of the insulating layer 120 is on the sides of the sensor 110 and is between the sensor 110 and the side magnetic bias structures 130. Another portion of the insulating layer 120 is on the back of the sensor 110. This portion of the insulating layer 120 is between the back of the sensor 110 and the refill 135. The insulating layer 120 adjoins, or shares an interface with, the sides and back of the sensor 110. Thus, only the bottom, top and MFS of the read sensor 110 are not covered by the insulating layer 120. The insulating layer 120 has an insulating layer coefficient of thermal expansion that matches the coefficient of thermal expansion of the barrier layer 116 to within certain limits. In some embodiments, the insulating layer coefficient of thermal expansion for the insulating layer 120 is at least ⅓ multiplied by the barrier layer coefficient of thermal expansion for the barrier layer 116. The insulating layer coefficient of thermal expansion for the insulating layer 120 is not more than ⅝ multiplied by the barrier layer coefficient of thermal expansion. In some such embodiments, the insulating layer coefficient of thermal expansion is at least one-half of the barrier layer coefficient of thermal expansion and not more than one and one-half multiplied by the barrier layer coefficient of thermal expansion. For example, the barrier layer coefficient of thermal expansion may be the same as the insulating layer coefficient of thermal expansion. Further, the insulating layer 120 is relatively thin. In some embodiments, the insulating layer 120 is at least 1.5 nanometers thick and not more than 3.5 nanometers thick. For example, the insulating layer 120 may be nominally 2 nanometers thick. However, other thicknesses are possible.

In some embodiments, the barrier layer 116 and the insulating layer 120 consist of the same material. The insulating layer 120 may also be made using the same process(es) as the barrier layer 116 in order to achieve matching coefficients of thermal expansion. As discussed above, the barrier layer 116 may include $MgO_x$. In such embodiments, the insulating layer 120 may include at least one of $MgO_y$ and silicon nitride, where y is not less than 0.5 multiplied by x and not more than 1.5 multiplied by x. The $MgO_y$ for the insulating layer 120 may be formed in the same manner as the $MgO_x$ for the barrier layer 116. In some embodiments, the insulating layer is a trilayer. For example, the insulating layer 120 may be a Mg/$MgO_y$/Mg trilayer, an $MgO_x$/Mg/$MgO_y$ trilayer or an $MgO_x$/$MgO_y$/$MgO_z$ trilayer, where x, y and z are greater than zero, not more than two and need not be whole numbers. In some cases, x, y and z are equal. Taken as a whole, the insulating layer 120 may be considered to be a magnesium oxide layer having a varying stoichiometry. In some such embodiments, the barrier layer 116 is also trilayer formed in an analogous manner as the insulating layer 120.

The magnetic read apparatus 100 may be suitable for use at higher densities, and particularly for higher density TDMR. Because of the presence of the insulating layer 120, the sensor 110 is better able to withstand later annealing. The insulating layer 120 has an insulating layer coefficient of thermal expansion that may match the barrier layer coefficient thermal of expansion. As a result, the expansion of the insulating layer 120 during an anneal more closely matches that of the barrier layer 116. Consequently, the stress on the sensor 110 and barrier layer 116 during an anneal is reduced. Local stress-induced atomic diffusion and the attendant widening of the barrier layer 116 may be reduced. Consequently, changes in amplitude of the magnetoresistance, amplitude asymmetry of the magnetoresistance and the resistance due to anneal(s) may be reduced. Performance may thus be improved. Further, reliability of the sensor 110 may also be enhanced. The magnetic read apparatus 100 may be suitable for high density magnetic recording applications as well as TDMR.

Figure 2A:
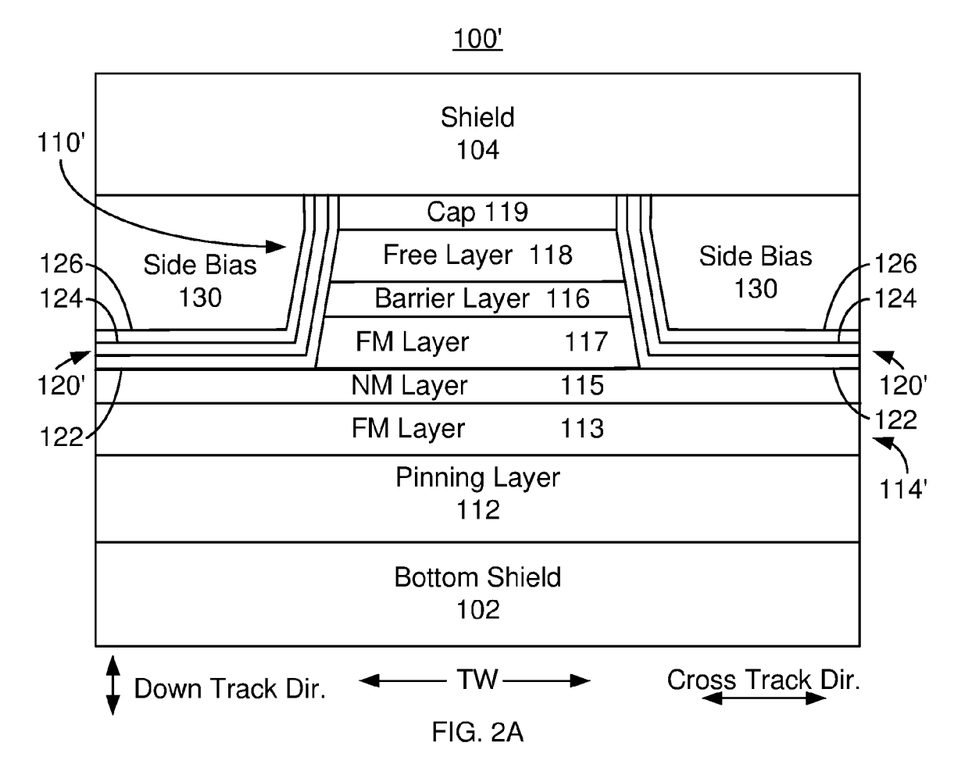
FIGS. 2A and 2B depict media-facing surface and apex views of another exemplary embodiment of a magnetic recording read apparatus.
Figure 2B:
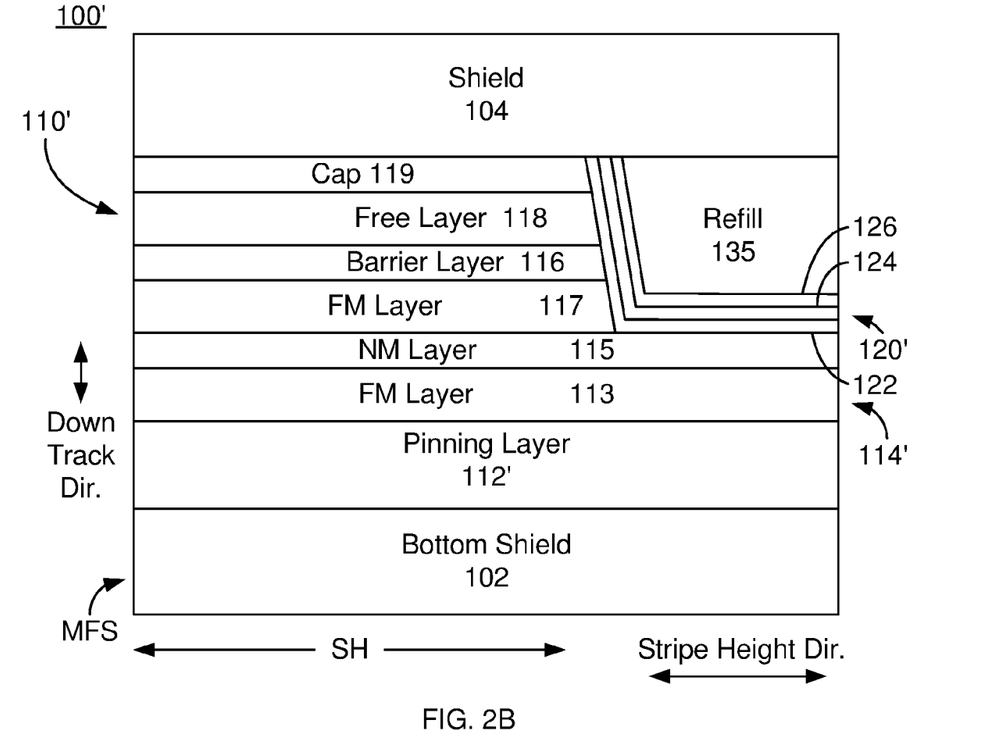

FIGS. 2A and 2B depict MFS and apex views of another exemplary embodiment of a portion of a read apparatus 100'. For clarity, FIGS. 2A-2B are not to scale. For simplicity not all portions of the read apparatus 100' are shown. In addition, although the read apparatus 100' is depicted in the context of particular components other and/or different components may be used. For simplicity, only single components are shown. However, multiples of each components and/or and their sub-components, might be used. The read apparatus 100' is analogous to the read apparatus 100. Consequently, similar components have analogous labels. The read apparatus 100' may be contained in a data storage device, such as a disk drive.

The read apparatus 100' includes a bottom shield 102, an upper shield 104, a read sensor 110', an insulating layer 120', magnetic bias structures 130 and refill 135. As discussed above, portions of the components 102, 104, 110', 120', 130 and/or 135 may include multiple layers.

The read sensor 110' may be a TMR sensor or analogous device. The read sensor 110' has sides in the cross-track direction, a front surface that is at the MFS and a rear surface that is opposite to the MFS. The read sensor 110' includes a pinning layer 112, a pinned layer 114', a tunneling barrier layer 116, a free layer 118 and an optional capping layer 119. The pinning layer 112 extends further than the free layer 118. The pinned layer 114' is a multilayer including layers 113, 115 and 117. Layers 113 and 117 are magnetic layers separated by a nonmagnetic layer 115. The magnetic moments (not shown) of the layers 113 and 117 may be antiferromagnetically coupled.

The insulating layer 120' resides on and adjoins the sides and the back of the read sensor 110'. Only the bottom, top and MFS of the read sensor 110' are not covered by the insulating layer 120'. The insulating layer 120' has an insulating layer coefficient of thermal expansion that may match the barrier layer coefficient of thermal expansion of the barrier layer 116. In some embodiments, the insulating layer coefficient of thermal expansion is at least ⅓ multiplied by the barrier layer coefficient of thermal expansion and not more than 5/3 multiplied by the barrier layer coefficient of thermal expansion. In some such embodiments, the insulating layer coefficient of thermal expansion is at least half of the barrier layer coefficient of thermal expansion and not more than one and one-half multiplied by the barrier layer coefficient of thermal expansion. For example, the barrier layer coefficient of thermal expansion may be the same as the insulating layer coefficient of thermal expansion.

The insulating layer 120' is a trilayer including layers 122, 124 and 126. The insulating layer 120' may include an Mg layer 122, an MgO layer 124 and an Mg layer 126. In other embodiments, the insulating layer 120' may include an MgO layer 122, an Mg layer 124 and an $MgO_y$ layer 126. Alternatively, the insulating layer 120' may include an $MgO_x$ layer 122, an $MgO_y$ layer 124 and an $MgO_z$ layer 126, where x, y and z are greater than zero and not more than two. The subscripts x, y and z need not be whole numbers. In some cases, x, y and z are equal. Taken as a whole, the insulating layer 120' may be considered to be a magnesium oxide layer having a varying stoichiometry.

The magnetic read apparatus 100' may share at least some of the benefits of the magnetic read apparatus 100. The magnetic read apparatus 100' may be suitable for use at higher densities. Because of the insulating layer 120', the sensor 110' is better able to withstand later annealing. Consequently, changes in amplitude of the magnetoresistance, amplitude asymmetry of the magnetoresistance and the resistance due to anneals may be reduced. Performance may thus be improved. Further, reliability of the sensor 110' may also be enhanced. Consequently, the magnetic read apparatus 100' may be suitable for high density magnetic recording applications, including TDMR.

Figure 3:
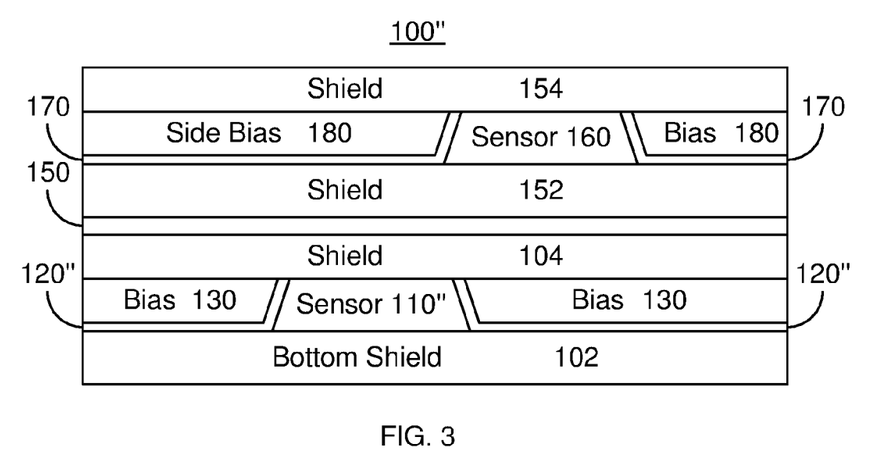
FIG. 3 depicts media-facing surface view of an exemplary embodiment of a two-dimensional magnetic recording read apparatus.

FIG. 3 depicts a MFS view of another exemplary embodiment of a portion of a read apparatus 100". For clarity, FIG. 3 is not to scale. For simplicity not all portions of the read apparatus 100" are shown. In addition, although the read apparatus 100" is depicted in the context of particular components other and/or different components may be used. For simplicity, only single components are shown. However, multiples of each components and/or and their sub-components, might be used. The read apparatus 100" is analogous to the read apparatus(es) 100 and/or 100'. Consequently, similar components have analogous labels. The read apparatus 100" may be contained in a data storage device, such as a disk drive.

The read apparatus 100" includes a bottom shield 102, an upper shield 104, a read sensor 110", an insulating layer 120", magnetic bias structures 130 and refill (not shown) that are analogous to bottom shield 102, upper shield 104, read sensor 110/110', insulating layer 120/120', magnetic bias structures 130 and refill 135. As discussed above, portions of the components 102, 104, 110', 120', 130 and/or 135 may include multiple layers.

In addition, the read apparatus 100" includes an additional shield 152, a top shield 154, sensor 160, insulating layer 170 and side bias structure 180 that are analogous to the shield 102, upper shield 104, sensor 110/110', insulating layer 120/120'/120" and side bias 130, respectively. Also shown is optional insulator 150 which allows current to be driven independently through the sensors 110" and 160. The read apparatus 100" is a TDMR read apparatus.

The magnetic read apparatus 100" may share at least some of the benefits of the magnetic read apparatus 100 and/or 100'. The magnetic read apparatus 100" may be suitable for use at higher densities. Because of the insulating layer 120", the sensor 110' is better able to withstand later annealing, such as high temperature anneals for the sensor 160. Consequently, changes in amplitude of the magnetoresistance, amplitude asymmetry of the magnetoresistance and the resistance due to anneals may be reduced. Performance may thus be improved. Further, reliability of the sensor 110" may also be enhanced. Consequently, the magnetic read apparatus 100" may be suitable for high density TDMR.

Various features of the magnetic recording apparatuses 100, 100' and 100" have been depicted and described herein. One of ordinary skill in the art will recognize that these features may be combined in other manners not explicitly disclosed herein.

Figure 4:
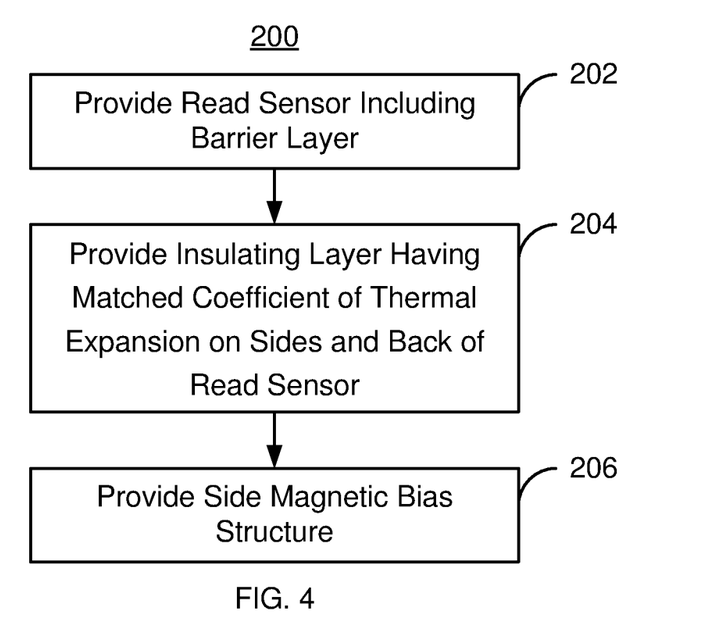
FIG. 4 is flow chart depicting an exemplary embodiment of a method for providing a magnetic read apparatus.

FIG. 4 depicts an exemplary embodiment of a method 200 for providing a magnetic read apparatus such as the magnetic read apparatus 100, 100' and/or 100". For simplicity, some steps may be omitted, interleaved, combined and/or include substeps. The method 200 is described in the context of providing the magnetic read apparatus 100. The method 200 may also be used to fabricate other magnetic recording apparatuses including but not limited to the magnetic write apparatuses 100' and/or 100". The method 200 is described in the context of a single device but may be used to fabricate multiple magnetic storage apparatuses at substantially the same time. The method 200 is also described in the context of particular layers. A particular layer may include multiple materials and/or multiple sub-layers. The method 200 also may start after formation of other portions of the magnetic recording apparatus.

The read sensor 110 is provided, via step 202. Step 202 includes providing a stack of layers 112, 114, 116 and 118. Thus, the barrier layer 116 is deposited as part of step 202. One or more high temperature anneals may also be performed as part of step 202. The sides and back surface of the read sensor 110 are also defined. Thus, step 202 may include providing mask(s) having the desired width for the track width of the sensor 110 and the desired depth for the stripe height of the read sensor 110. The exposed portions of the stack are removed, for example via one or more ion mills. Therefore, the read sensor 110 may be formed. However, the MFS may be defined later, for example via lapping.

The insulating layer 120 is formed, via step 204. Step 204 is carried out so that the insulating layer coefficient of thermal expansion matches the barrier layer coefficient of thermal expansion within the ranges described above. Step 204 may include depositing a metallic layer and oxidizing the metal, depositing an oxide such as $MgO_x$, depositing a nitride such as $SiN_y$, forming a nitride such as $SiN_y$ in another manner, or other processes. Thus, the coefficients of thermal expansion for the layers 116 and 120 may match.

The side magnetic bias structures 130 are also provided, via step 206. Step 206 is performed after step 204 is performed. Thus, the insulating layer 120 is between the sides of the read sensor 110 and the side magnetic bias structures 130. Fabrication of the read apparatus 100 may then be completed. For example, the insulating refill material 135, such as aluminum oxide, may be deposited. The shield 104 and other structures may also be formed.

Using the method 200, a read apparatus 100 having improved performance at higher areal densities and for TDMR may be fabricated. Thus, the benefits of the read apparatus 100, 100' and/or 100" may be obtained.

Figure 5:
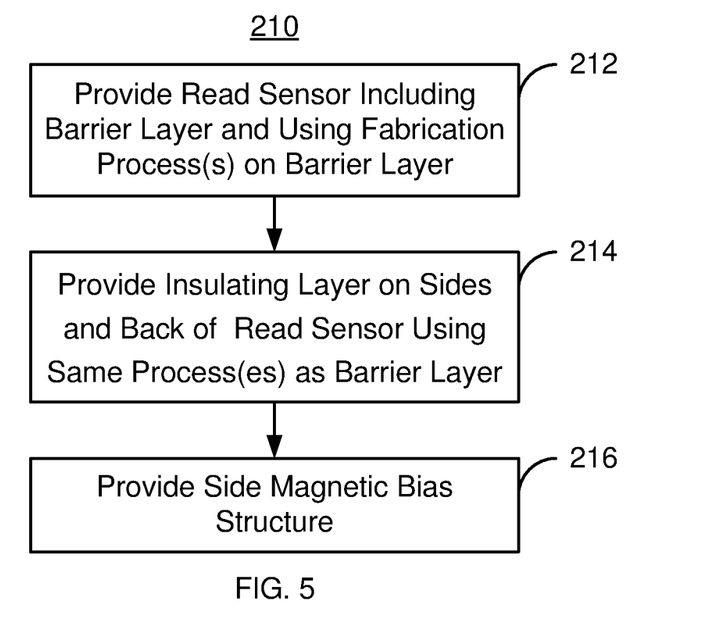
FIG. 5 is flow chart depicting another exemplary embodiment of a method for providing a magnetic read apparatus.

FIG. 5 depicts an exemplary embodiment of a method 210 for providing a magnetic read apparatus such as the magnetic read apparatus 100, 100' and/or 100". For simplicity, some steps may be omitted, interleaved, combined and/or include substeps. The method 210 is described in the context of providing the magnetic read apparatuses 100 and 100'. The method 210 may also be used to fabricate other magnetic recording apparatuses including but not limited to the magnetic write apparatus 100". The method 210 is described in the context of a single device but may be used to fabricate multiple magnetic storage apparatuses at substantially the same time. The method 210 is also described in the context of particular layers. A particular layer may include multiple materials and/or multiple sub-layers. The method 210 also may start after formation of other portions of the magnetic recording apparatus.

The read sensor 110/110' is provided, via step 212. Step 212 includes providing a stack of layers 112', 114', 116 and 118. Thus, the barrier layer 116 is formed as part of step 212. As part of step 212, a particular set of process(es) are used to form the barrier layer 116. In some embodiments, a metal layer such as Mg may be deposited and then oxidized to form an oxide such as MgO. In other embodiments, the insulator is deposited for example via radio-frequency sputtering. In still other embodiments, a multilayer may be deposited. For example, a metal layer may be deposited and oxidized, an oxide layer may be deposited, and then another metal layer may be deposited and oxidized. Alternatively, an oxide layer may be deposited, a metal layer may be deposited and oxidized and another oxide layer deposited. In such embodiments, the metal layer may not be completely oxidized. Thus, some metal may remain. In other embodiments, a metal layer may be provided, an oxide provided either by partially oxidizing the metal layer or depositing an oxide and another metal layer deposited. In still other embodiments, different steps may be performed to fabricate the barrier layer 116. After the layers of the stack are provided, the sides and back surface of the read sensor 110/110' are defined as part of step 212. Thus, one or more masks having the desired width for the track width of the sensor 110/110' and the desired depth for the stripe height of the read sensor 110/110' may be provided. The exposed portions of the stack are removed, for example via ion mill(s) or other etch processes.

The insulating layer 120/120' is formed, via step 214 using the same processes as were used for the barrier layer 116. For example, if the barrier layer 116 is formed by depositing a metal layer such as Mg and oxidizing the layer, then step 214 deposits a metal layer of the same metal and oxidizes the layer. If multiple layers are formed as part of fabricating the barrier layer 116, then multiple layers are provided as part of step 214. For example, if the barrier layer 116 is fabricated by depositing and oxidizing a metal layer, depositing an oxide layer, and then depositing and oxidizing another metal layer, then the same steps are performed in the same order to form the insulating layer 120/120'. Alternatively, if an oxide layer is deposited, a metal layer deposited on the oxide layer and oxidized and another oxide layer deposited to form the barrier layer 116, then these steps are followed for the insulating layer 120/120'. In such embodiments, the metal layer may not be completely oxidized. Thus, some metal may remain between the oxide layers. If the barrier layer 116 is formed by depositing a metal layer such as Mg, providing an oxide either by partially oxidizing the metal layer or depositing an oxide and depositing another metal layer such as Mg, then the insulating layer 120 may be formed in the same manner. Thus, the same process steps are followed in step 214 as in step 212. However, the thicknesses of the layers formed may differ. For example, the insulating layer 120/120' may be thicker than the barrier layer 116. In other embodiments, the insulating layer 120/120' may have the same thickness as or a smaller thickness than the barrier layer 116. Because the same process steps and same materials are used in step 214 as in step 212, the insulating layer coefficient of thermal expansion matches the barrier layer coefficient of thermal expansion within the ranges described above.

The side magnetic bias structures 130 are also provided, via step 216. Step 216 is performed after step 214 is performed. Thus, the insulating layer 120/120' is between the sides of the read sensor 110/110' and the side magnetic bias structures 130. Fabrication of the read apparatus 100/100' may then be completed. For example, the insulating refill material 135, such as aluminum oxide, may be deposited. The shield 104 and other structures may also be formed.

Using the method 210, a read apparatus 100/100' having improved performance at higher areal densities and for TDMR may be fabricated. Thus, the benefits of the read apparatus 100, 100' and/or 100" may be obtained.

Figure 6:
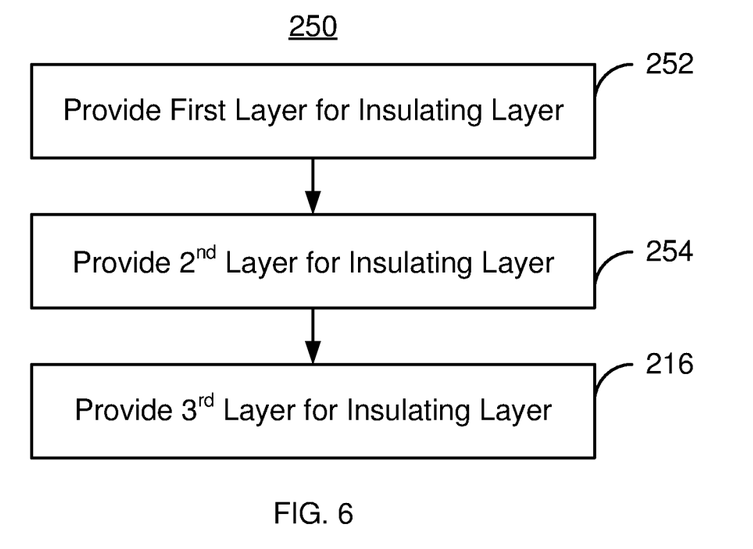
FIG. 6 is flow chart depicting an exemplary embodiment of a method for providing an insulating layer for a read sensor in a magnetic read apparatus.

FIG. 6 depicts an exemplary embodiment of a method 250 for providing an insulating layer 120/120' for a read sensor in a magnetic read apparatus such as the magnetic read apparatus 100, 100' and/or 100". For simplicity, some steps may be omitted, interleaved, combined and/or include sub-steps. The method 250 is described in the context of providing the magnetic read apparatus 100'. The method 250 may also be used to fabricate other magnetic recording apparatuses including but not limited to the magnetic write apparatuses 100 and/or 100". The method 250 is described in the context of a single device but may be used to fabricate multiple magnetic storage apparatuses at substantially the same time. The method 250 is also described in the context of particular layers. A particular layer may include multiple materials and/or multiple sub-layers. The method 250 also may start after formation of other portions of the magnetic recording apparatus.

The first layer 122 of the insulating layer 120' is provided, via step 252. Step 252 may include depositing a metal layer such as Mg, depositing and oxidizing a metal layer to form an oxide such as $MgO_x$, depositing an oxide such as $MgO_x$, or forming a nitride such as $SiN_t$, where t and x are greater than zero and not more than two, but need not be whole numbers.

The second layer 124 of the insulating layer 120' is provided, via step 254. Step 254 my include depositing a metal layer such as Mg, depositing and oxidizing a metal layer to form an oxide such as $MgO_y$, depositing an oxide such as $MgO_y$, or forming a nitride such as $SiN_u$, where u and y are greater than zero and not more than two, but need not be whole numbers.

The third layer 124 of the insulating layer 120' is provided, via step 254. Step 254 my include depositing a metal layer such as Mg, depositing and oxidizing a metal layer to form an oxide such as $MgO_z$, depositing an oxide such as $MgO_z$, or forming a nitride such as $SiN_w$, where w and z are greater than zero and not more than two, but need not be whole numbers. Note, however, that at least one of the layers 122, 124 and 126 formed using steps 252, 254 and 256 is an insulator. Thus, steps 252, 254 and 256 cannot all consist of depositing a metal layer only. Thus, the insulating layer 120' may be an Mg/MgO/Mg trilayer, an $MgO_x$/Mg/$MgO_y$ trilayer, an $MgO_x$/$MgO_y$/$MgO_z$ trilayer or another trilayer, where x, y and z are greater than zero, not more than two and need not be whole numbers. In some embodiments, the barrier layer 116 is also a trilayer. In all cases, the insulating layer coefficient of thermal expansion for the insulating layer 120' formed using the method 250 may match the barrier layer coefficient of thermal expansion for the barrier layer 116.

Using the method 250, an insulating layer 120' for a read apparatus 100/100'/100" may be provided. The insulating layer 120' allows the read sensor 110/110'/110" to maintain sufficient performance despite subsequent anneals, such as those carried out for the sensor 160. Therefore, the benefits of the read apparatus 100, 100' and/or 100" may be obtained.

What is claimed is:

1. A magnetic read apparatus having a media-facing surface (MFS), the magnetic read apparatus comprising:
 a read sensor comprising a free layer, a pinned layer, and a barrier layer between the free layer and the pinned layer, the read sensor having a side surface, a front surface occupying a portion of the MFS, and a back surface opposite the front surface, the barrier layer having a barrier layer coefficient of thermal expansion;
 a side magnetic bias structure adjacent to the side surface of the read sensor; and
 an insulating layer comprising a first portion and a second portion, the first portion of the insulating layer being between the side surface of the read sensor and the side magnetic bias structure, the second portion of the insulating layer adjoining the back surface, the insulating layer having an insulating layer coefficient of thermal expansion, the insulating layer coefficient of thermal expansion being at least 1/3 of the barrier layer coefficient of thermal expansion and not more than 5/3 of the barrier layer coefficient of thermal expansion, and wherein each of the first portion and the second portion of the insulating layer comprises a trilayer.

2. The magnetic read apparatus of claim 1 wherein the barrier layer comprises $MgO_x$, wherein the insulating layer comprises at least one of $MgO_y$ and silicon nitride, and wherein y is not less than 0.5 multiplied by x and not more than 1.5 multiplied by x.

3. The magnetic read apparatus of claim 1 further comprising:
 an aluminum oxide refill layer, the second portion of the insulating layer being between the aluminum oxide refill layer and the back surface of the read sensor.

4. The magnetic read apparatus of claim 1 wherein the trilayer is selected from an Mg/MgO/Mg trilayer, an $MgO_x$/Mg/$MgO_y$ trilayer and an $MgO_x$/$MgO_y$/$MgO_z$ trilayer, where x, y and z are greater than zero and not more than two.

5. The magnetic read apparatus of claim 4 wherein x and y are equal.

6. The magnetic read apparatus of claim 1 wherein the barrier layer comprises a particular material and the insulating layer comprises the particular material.

7. The magnetic read apparatus of claim 1 wherein the barrier layer comprises a trilayer.

8. The magnetic read apparatus of claim 1 wherein the insulating layer is at least 1.5 nanometers thick and not more than 3.5 nanometers thick.

9. The magnetic read apparatus of claim 1 wherein the barrier layer coefficient of thermal expansion matches the insulating layer coefficient of thermal expansion.

10. The magnetic read apparatus of claim 1 wherein the trilayer of the first portion of the insulating layer comprises a first layer, a second layer, and a third layer.

11. The magnetic read apparatus of claim 1 wherein the trilayer of the second portion of the insulating layer comprises a first layer, a second layer, and a third layer.

12. A data storage device comprising:
 at least one medium; and
 at least one magnetic read apparatus comprising a media-facing surface (MFS), the at least one magnetic read apparatus comprising a read sensor, a side magnetic bias structure and an insulating layer, the read sensor comprising a free layer, a pinned layer, and a barrier layer between the free layer and the pinned layer, the read sensor having a side surface, a front surface occupying a portion of the MFS, and a back surface opposite the front surface, the barrier layer having a barrier layer coefficient of thermal expansion, the side magnetic bias structure being adjacent to the side surface of the read sensor, the insulating layer comprising a first portion and a second portion,
 the first portion of the insulating layer being between the side surface of the read sensor and the side magnetic bias structure, the second portion of the insulating layer adjoining the back surface, the insulating layer having an insulating layer coefficient of thermal expansion, the insulating layer coefficient of thermal expansion being at least 1/3 of the barrier layer coefficient of thermal expansion and not more than 5/3 of the barrier layer coefficient of thermal expansion, and wherein each of the first portion and the second portion of the insulating layer comprises a trilayer.

13. The data storage device of claim 12 wherein the barrier layer comprises $MgO_x$ and wherein the insulating layer comprises at least one of $MgO_y$ and silicon nitride, and wherein y is not less than 0.5 multiplied by x and not more than 1.5 multiplied by x.

14. The data storage device of claim 12 wherein the trilayer is selected from an Mg/MgO/Mg trilayer, an $MgO_x$/Mg/$MgO_y$ trilayer and an $MgO_x$/$MgO_y$/$MgO_z$ trilayer, where x, y and z are greater than zero and not more than two.

15. The data storage device of claim 12 wherein the barrier layer comprises a particular material and the insulating layer comprises the particular material.

16. A method for providing a magnetic read apparatus having a media-facing surface (WS), the method comprising:
 providing a read sensor, the step of providing the read sensor comprising:
  providing a free layer;
  providing a pinned layer; and
  providing a barrier layer between the free layer and the pinned layer, the read sensor having a side surface, a front surface occupying a portion of the MFS, and a back surface opposite the front surface, the barrier layer having a barrier layer coefficient of thermal expansion;
 providing a side magnetic bias structure adjacent to the side surface of the read sensor; and
 providing an insulating layer comprising a first portion and a second portion, the first portion of the insulating layer being between the side surface of the read sensor and the side magnetic bias structure, the second portion of the insulating layer adjoining the back surface, the insulating layer having an insulating layer coefficient of thermal expansion, the insulating layer coefficient of thermal expansion being at least 1/3 of the barrier layer coefficient of thermal expansion and not more than 5/3 of the barrier layer coefficient of thermal expansion, and wherein each of the first portion and the second portion of the insulating layer comprises a trilayer.

17. The method of claim 16 wherein the barrier layer comprises $MgO_x$ and wherein the insulating layer comprises at least one of $MgO_y$ and silicon nitride, and wherein y is not less than 0.5 multiplied by x and not more than 1.5 multiplied by x.

18. The method of claim 16 wherein the step of providing the barrier layer comprises:
 providing the barrier layer selected from an Mg/MgO/Mg trilayer, an $MgO_x$/Mg/$MgO_y$ trilayer and an $MgO_x$/

$MgO_y/MgO_z$ trilayer, where x, y and z are greater than zero and not more than two; and wherein the step of providing the insulating layer comprises providing the trilayer selected from an additional Mg/MgO/Mg trilayer, an $MgO_y/Mg/MgO_w$ layer and an $MgO_v/MgO_w/MgO_u$, where u, w and v are greater than zero and not more than two.

19. The method of claim 16 wherein the step of providing the barrier layer comprises:

providing a first insulating layer using a first process;

wherein the step of providing the insulating layer comprises providing a second insulating layer using the first process.

20. The method of claim 16 wherein the step of providing the barrier layer comprises:

providing a first sublayer of the barrier layer using a first process;

providing a second sublayer of the barrier layer using a second process; and providing a third sublayer of the barrier layer using a third process, the first sublayer, the second sublayer and the third sublayer forming the barrier layer; and wherein the step of providing the insulating layer comprises providing a first layer of the insulating layer using the first process;

providing a second layer of the insulating layer using the second process; and providing a third layer of the insulating layer using the third process.

* * * * *